(12) United States Patent
Johancsik et al.

(10) Patent No.: US 8,242,946 B2
(45) Date of Patent: Aug. 14, 2012

(54) PIPELINED ANALOG-TO-DIGITAL CONVERTER

(75) Inventors: Tracy Johancsik, Murray, UT (US); Rex K. Hales, Riverton, UT (US)

(73) Assignee: Crest Semiconductors, Inc., San Jose, CA (US)

( * ) Notice: Subject to any disclaimer, the term of this patent is extended or adjusted under 35 U.S.C. 154(b) by 87 days.

(21) Appl. No.: 12/849,466

(22) Filed: Aug. 3, 2010

(65) Prior Publication Data
US 2010/0295714 A1 Nov. 25, 2010

Related U.S. Application Data

(63) Continuation-in-part of application No. 11/941,672, filed on Nov. 16, 2007, now Pat. No. 7,839,318.

(60) Provisional application No. 60/859,741, filed on Nov. 17, 2006.

(51) Int. Cl.
*H03M 1/38* (2006.01)
(52) U.S. Cl. ........................................ 341/161; 341/122
(58) Field of Classification Search .................. 341/122, 341/155, 161, 144
See application file for complete search history.

(56) References Cited

U.S. PATENT DOCUMENTS

| | | | |
|---|---|---|---|
| 5,043,732 A | 8/1991 | Robertson et al. | |
| 5,592,164 A * | 1/1997 | Hilbert et al. | 341/120 |
| 5,990,820 A | 11/1999 | Tan et al. | |
| 6,462,695 B1 | 10/2002 | Ahuja et al. | |
| 7,612,700 B2 * | 11/2009 | Kawahito et al. | 341/161 |
| 7,733,254 B2 * | 6/2010 | Smith et al. | 341/161 |
| 7,839,318 B2 * | 11/2010 | Wolf et al. | 341/162 |
| 2003/0076253 A1 | 4/2003 | Roovers et al. | |

FOREIGN PATENT DOCUMENTS
JP 09-232957 A 9/1997

* cited by examiner

*Primary Examiner* — Peguy Jean Pierre
(74) *Attorney, Agent, or Firm* — Steven L. Nichols; VanCott, Bagley, Cornwall & McCarthy P.C.

(57) ABSTRACT

A pipelined Analog-to-Digital Converter (ADC) comprising a number of stages, at least one of the stages includes a sample and hold circuit. The sample and hold circuit includes a first output connected to an input of a sub-ADC, an output of the sub-ADC connected to an input of a Digital-to-Analog Converter (DAC), an output of the DAC connected to a node, and a second output connected to the node. The sample and hold circuit is configured to independently scale a signal produced by the first output and a signal produced by the second output.

20 Claims, 10 Drawing Sheets

PIPELINED ANALOG-TO-DIGITAL CONVERTER

RELATED APPLICATIONS

The present application is a continuation-in-part of and claims priority under 35 U.S.C. §120 from previous allowed U.S. patent application Ser. No. 11/941,672, filed Nov. 16, 2007 and entitled "Pipelined Analog-to-Digital Converter," which previous application claimed the priority under 35 U.S.C. §119(e) of U.S. Provisional Patent Application No. 60/859,741, entitled "Pipelined Analog-to-Digital Converter," filed Nov. 17, 2006. Both previous applications are hereby incorporated by reference in their respective entireties.

BACKGROUND

Electronic devices typically make use of both analog and digital signals. An analog signal is a continuous signal which may assume any value. A digital signal is one in which may assume one of a discrete set of values. A signal may be in the form of an electrical current or a voltage. Electrical current is the measurement of the flow of electrons. Voltage may be defined as the difference between electric potential at two given points.

Electronic circuitry often includes devices for transferring analog signals into digital signals and vice versa. For example, a Digital-to-Analog Converter (DAC) may be used to transfer digital signals into analog signals. Conversely, an Analog-to-Digital Converter (ADC) may be used to transfer analog signals into digital signals.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
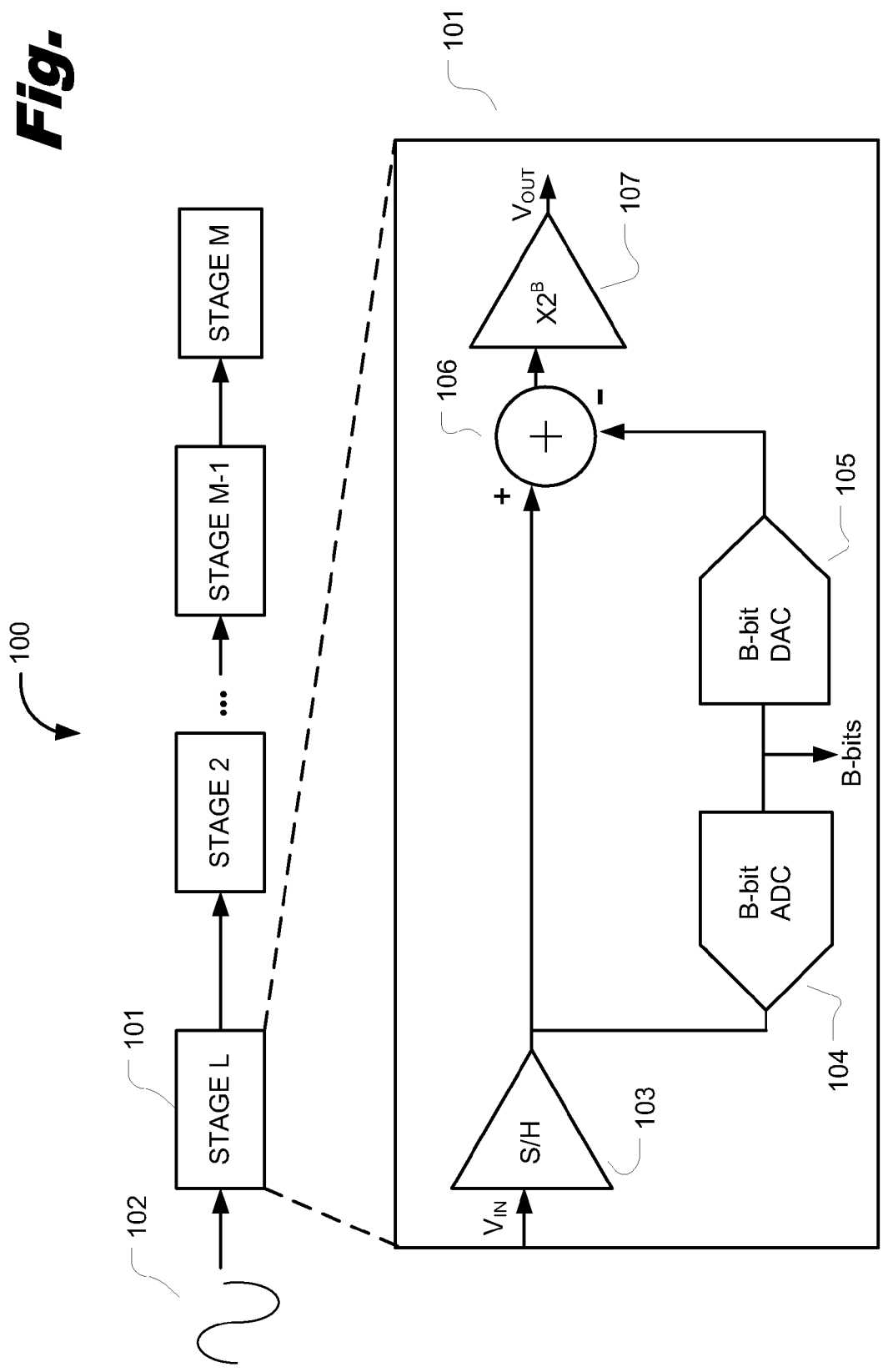
FIG. 1 illustrates an exemplary voltage mode pipelined analog-to-digital converter (ADC) according to principles described herein.

One type of ADC which is used to convert analog signals to digital signals is a pipelined ADC. A pipelined ADC includes a number of stages. Each stage subtracts a quantized component of the analog signal to determine some of the total number of bits produced for one sampled output of the pipelined ADC.

The present specification discloses a pipelined ADC which provides additional flexibility for the components used in each stage. According to certain illustrative examples, the pipelined ADC includes a number of stages. At least one of said stages includes a sample and hold circuit. The sample and hold circuit includes two outputs. The first output is connected to an input of a sub-ADC. The output of the sub-ADC is connected to an input of a Digital-to-Analog Converter (DAC). The output of the DAC is connected to a node. A second output of the sample and hold circuit is also connected to the node. The node combines a signal from the second output of the sample and hold with an output of the DAC to form a residue signal. The residue signal is then input into a subsequent stage. The sample and hold circuit is configured to independently scale a signal produced by the first output and a signal produced by the second output.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

The present specification describes, among other things, exemplary current mode pipelined analog-to-digital converters (ADCs). As will be described in more detail below, the use of pipelined current mode ADCs is advantageous in many systems and often results in reduced power consumption, fewer components, lower cost, faster operating speeds, simplified layout, and higher accuracy.

In some examples, as will be described in more detail below, a current mode ADC operates, for example, by comparing the current of an input signal to one or more reference currents to create a digital representation of the incoming signal. The ADC described herein may be used in a variety of applications including but not limited to, battery level measurement (metering), communications, imaging, measurement, control systems, sensors, etc.

As described above, traditional circuits are designed in terms of voltage. For example, in the field of analog-to-digital conversion, voltage mode ADCs compare the voltage of an input signal to a number of reference voltages to determine which reference voltage is closest to the voltage of the input signal. A digital representation of the input signal may then be created based on a series of such voltage comparisons.

In contrast, there are several advantages to designing circuits in terms of current. As will be described in more detail below, in current mode ADCs, for example, the current of an input signal may be compared to a plurality of current references to determine which reference current is closest to the current of the input signal. A digital representation of the input signal may then be created based on a series of such current comparisons.

One of the many advantages of this approach is that, because current sources are used instead of voltage references, operational voltage becomes far less of a limiting factor to circuit design. By allowing lower operating voltages to be used, the ADC can take better advantage of the increases in modern integrated circuit density. Also, since the voltages at nodes in a current mode circuit change very little, circuit and parasitic capacitances have much less effect on the speed of the circuit.

FIG. 1 illustrates an exemplary voltage mode pipelined ADC (100). As shown in FIG. 1, the pipelined ADC (100) includes a number of stages (101) through which an analog signal (102) is passed to produce a digital approximation of that analog signal. Each stage (101) may include a sample and hold circuit (S/H) (103), a B-bit ADC (104), a B-bit DAC (105), a summing block (106), and an amplifier (107). As will be appreciated by those skilled in the art, the pipelined ADC (100) can be either singled ended or differential. FIG. 1 is intended to be generic to either case. Consequently, each of the signal lines shown in FIG. 1 can be interpreted as either a single signal line or a pair of differential signal lines.

In some examples, as shown in FIG. 1, the analog input signal (102) is first sampled by the S/H circuit (103). As shown in FIG. 1, the S/H circuit (103) is voltage-based. The output of the S/H circuit (103) is then input into a B-bit ADC (104), which outputs a digital signal. The output of the ADC (104) is converted into an analog signal by a B-bit DAC (105). The summing block (106) subtracts the output of the DAC (105) from the output of the S/H circuit (103). The result of this subtraction is referred to as a residue signal. The residue signal is often very small and therefore has to be amplified by an amplifier (107) before being input into a subsequent stage. The process is repeated in each stage and the digital outputs of the B-bit ADCs (104) within each stage may be combined to achieve a desired resolution.

Figure 2A:
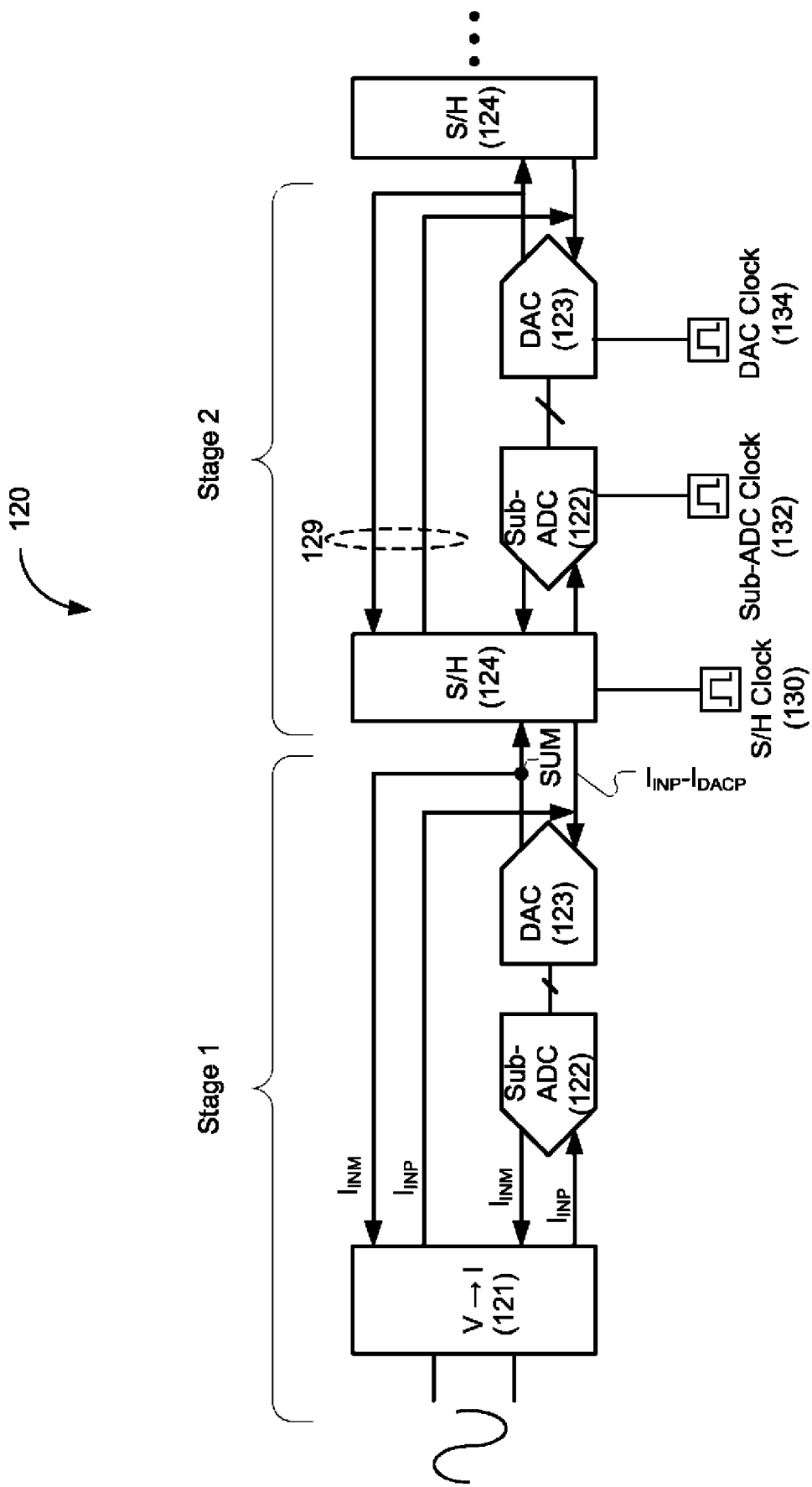
FIG. 2A illustrates an exemplary current mode pipelined ADC architecture according to principles described herein.

FIG. 2A illustrates an exemplary current mode pipelined ADC architecture (120) that may be used in accordance with the systems and methods described herein. As shown in FIG. 2A, the current mode pipelined ADC (120) includes a number of stages. The example shown in FIG. 2A is a differential example with paired differential signal lines between components. However, it will be appreciated by those skilled in the art that the ADC (120) of FIG. 2A may alternatively be single ended. In the illustrated example, the first stage includes a voltage-to-current converter (121), a current mode flash ADC (122) and a (DAC) 123. Each of the remaining stages includes a S/H circuit (124), a current mode flash ADC (122), and a DAC (123). Each of these components will be described in more detail below.

An analog input signal is first input into the voltage-to-current converter (121), which converts the input signal from voltage to current. It will be recognized that in some instances, the signal is already represented in terms of current and therefore does not have to be converted by a voltage-to-current converter (121). In such instances, the voltage-to-current converter (121) may be omitted entirely.

The voltage-to-current converter (121) may also be configured to function as a sample and hold circuit. In other words, the voltage-to-current converter (121) may be configured to sample the analog input signal and hold the value until it has been processed by the first stage. In some examples, the sample and hold function may be performed by an additional component placed in series behind the voltage-to-current converter (121).

The output signals of the voltage-to-current converter (121) are then input into a current mode flash ADC (122). As shown in FIG. 2A, the voltage-to-current converter (121) produces two copies of paired, differential currents ($I_{INM}$ and $I_{INP}$). The differential pair between the voltage-to-current converter (121) and the flash ADC (122) may be scaled, e.g., scaled down. With respect to the sample-and-hold (S/H) circuit (124) in the second stage (Stage 2), the differential pair of current signals between that S/H circuit (124) and the flash ADC (122) of the second stage (Stage 2) are also scaled down from the paired current signals between the first stage (Stage 1) and (Stage 2). However, the third pair of current signals (129) used by the S/H circuit (124) of the second stage (Stage 2) are an exact copy of the paired current signals between the first stage (Stage 1) and (Stage 2).

Figure 3:
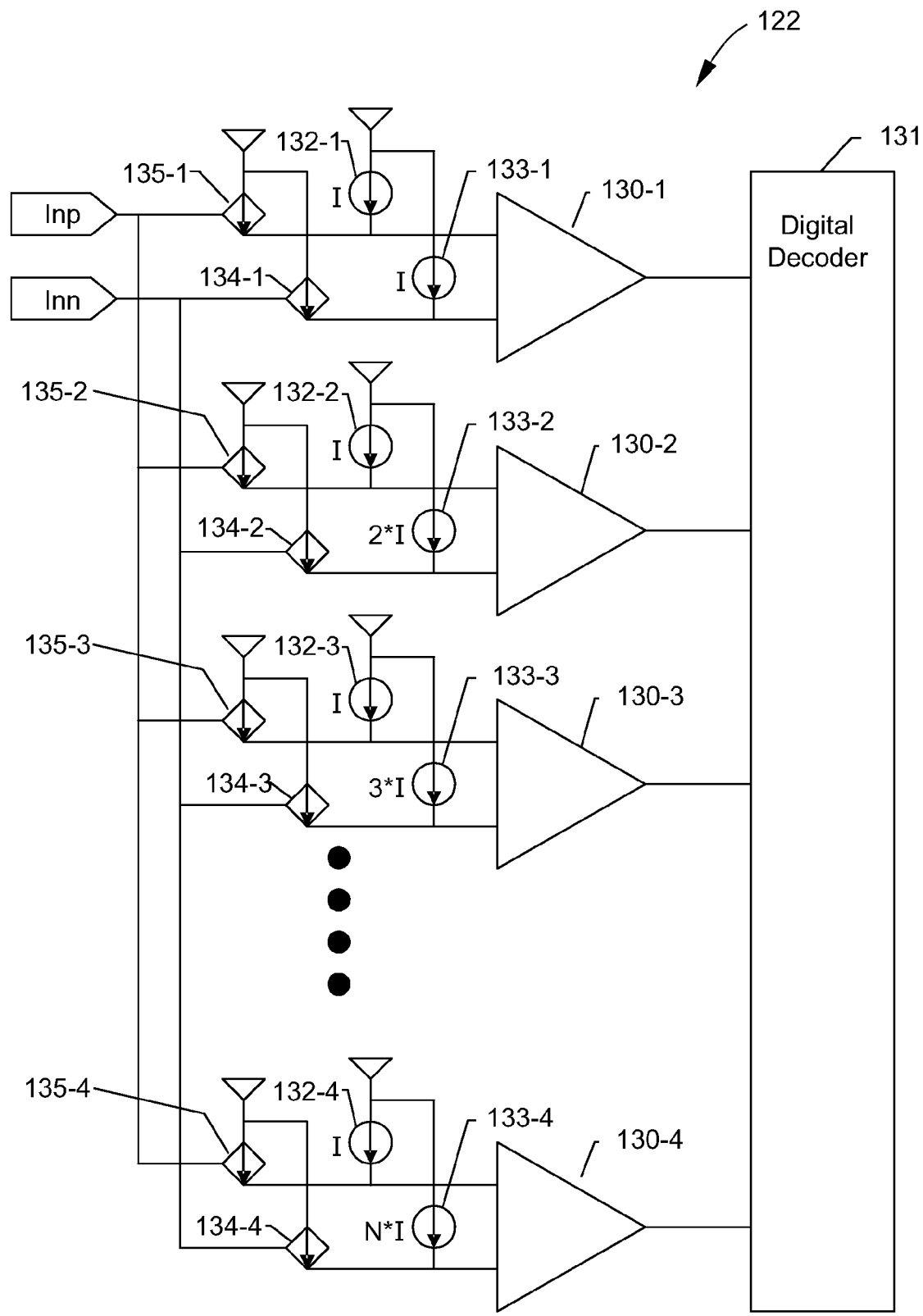
FIG. 3 shows an exemplary n-bit current mode ADC that may be used within the current mode pipelined ADC according to principles described herein.

FIG. 3 shows an exemplary n-bit current mode ADC (122) that may be used within the current mode pipelined ADC (120). As shown in FIG. 3, current comparators (e.g., 130-1 through 130-4, collectively referred to herein as 130) are connected to a digital decoder (131). The comparators (130) each receive current inputs and convert them to a number of digital outputs. Elements 132-1 through 132-4 (collectively referred to herein as 132) are current sources that are configured to add a DC bias to each input signal. Elements 133-1 through 133-4 (collectively referred to herein as 133) are current sources with output currents scaled from I to N*I, where N is equal to $2^n$. Because the inputs to the comparators 130 are currents, elements 135-1 through 135-4 and 134-1 through 134-4 are current controlled current sources having current equal to, or scaled versions of, input currents Inp and Inn respectively, to allow for combining the currents into the comparators.

Each of the current comparators (130) shown in FIG. 3 may include any combination of circuitry as may serve a particular application. For example, each current comparator (130) may include a sense amplifier. Sense amplifiers compare current values differentially, thereby avoiding problems with parasitic capacitances on the input lines. Current differences can be detected accurately at relatively high speeds without the need to wait for the voltages to slew to final values, the timing of which is relatively sensitive to parasitic capacitance. Additionally or alternatively, the current comparator may include any other type of current comparator as may serve a particular application.

Figure 4:
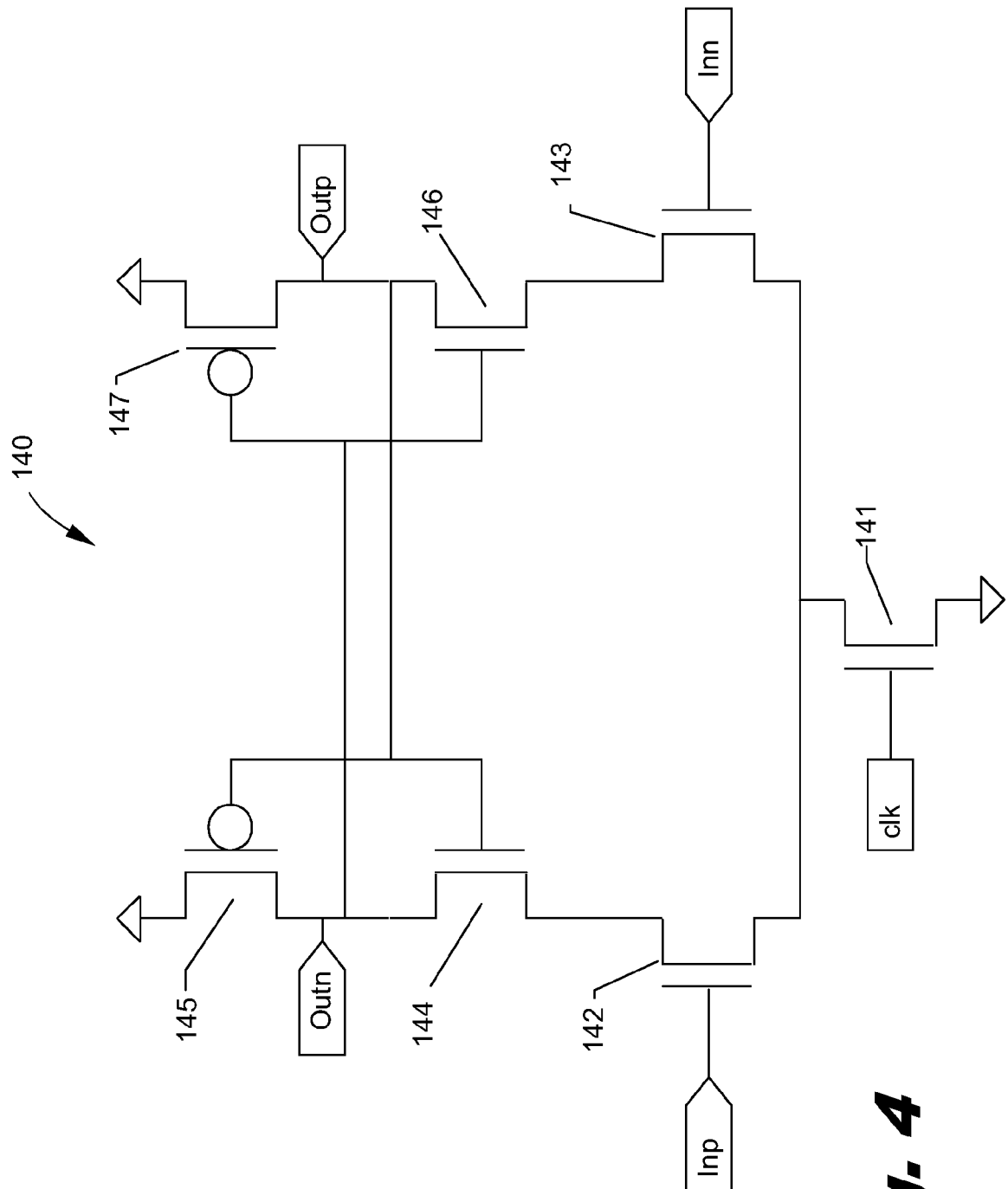
FIG. 4 illustrates an exemplary sense amplifier comparator that may be used as one or more of the current comparators shown in FIG. 3 according to principles described herein.

FIG. 4 illustrates an exemplary sense amplifier comparator (140) that may be used as one or more of the current comparators (130) shown in FIG. 3. The comparator (140) is configured to be able to detect very small voltage changes on the two input nodes Inp and Inn. In some examples, the Inp and Inn nodes are charged to the supply voltage while a clock input is held low. When the clock input goes high, the voltage at Inp or Inn starts to change as components discharge the capacitance of the Inp or Inn signal. At the same time, NMOS transistor (141) turns on and causes a current to start flowing in transistors (142) and (143). This current is proportional to the voltage at the gates of transistors (142) and (143). NMOS transistor (144) and NMOS transistor (145) together form an inverter with the Outn as the output and Outp as the input. As will be appreciated by those skilled in the art, Outp is a voltage. NMOS transistor (146) and NMOS transistor (147) form an inverter with Outp as the output Outn as the input. These transistors provide positive feedback that gives the circuit much higher gain than just the gain of the differential pair formed by transistors (142) and (143).

Figure 5:
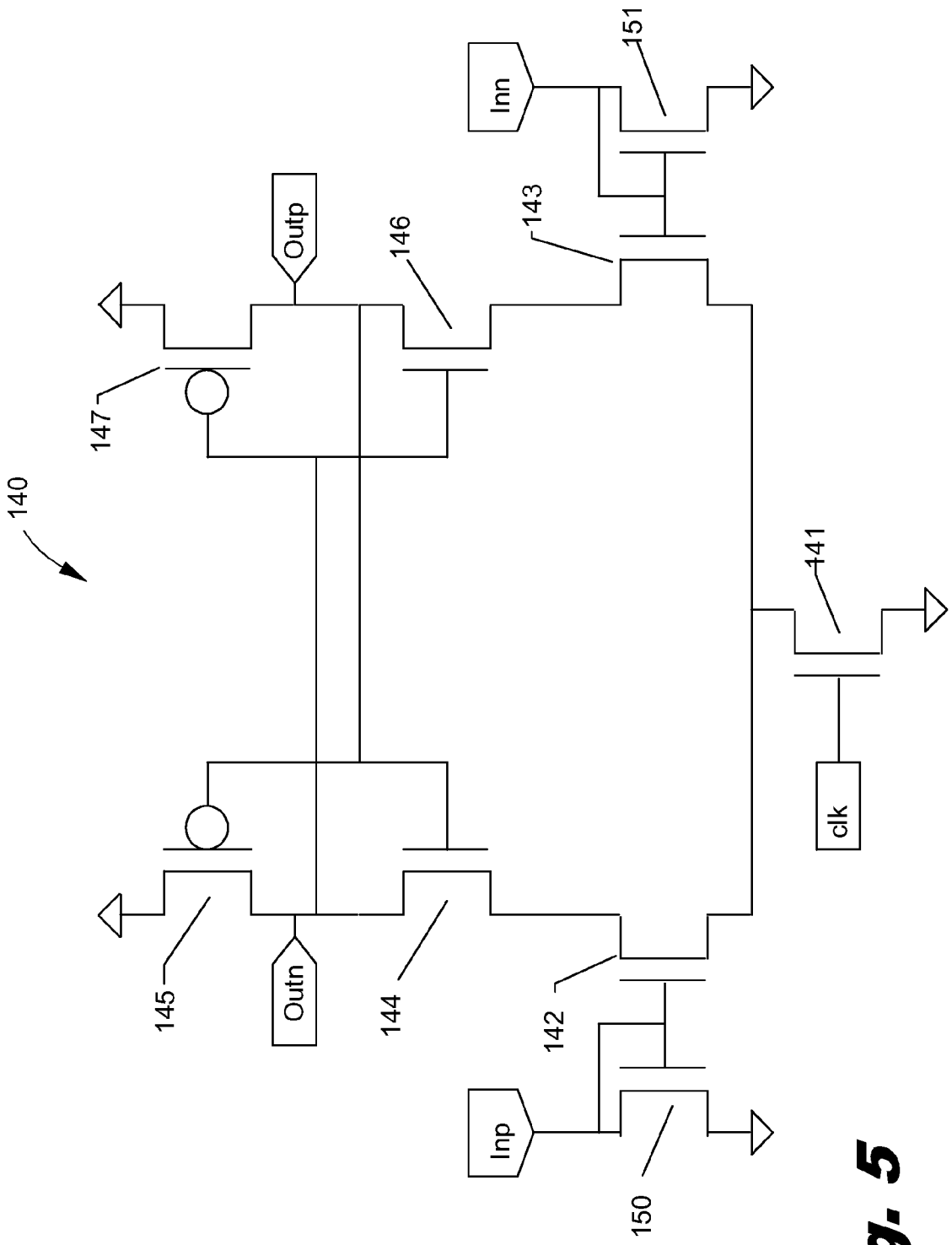
FIG. 5 shows a modification of the sense amp of FIG. 4 which gives a simple current mirror input to the sense amp comparator according to principles described herein.

FIG. 5 shows a modification of the sense amp of FIG. 4 which gives a simple current mirror input to the sense amp comparator (140). NMOS transistors (150) and (151) have been added to the configuration shown in FIG. 4 to form a current mirror configuration. When the clock input is high, the current in transistor (142) will be the same as transistor (150) because both transistors have the same gate voltage and nearly the same drain voltage as the drain voltage of transistor (142) is pulled close to ground by NMOS transistor (143). Likewise, the current in transistor (143) will be the same as transistor (151).

It will be recognized that the current mode flash ADC (122) illustrated in FIGS. 3-5 is merely exemplary of the many types of different current mode ADCs (122) that may be used in accordance with the systems and methods described herein.

Returning to FIG. 2A, the digital output of the current mode flash ADC (122) is input into a DAC (123), which converts the digital signal into an analog signal (IDAC). The amplitude of IDAC is typically very small, e.g., around 400 microamps. However, it will be recognized that the amplitude of IDAC may have any value as may serve a particular application.

Figure 2B:
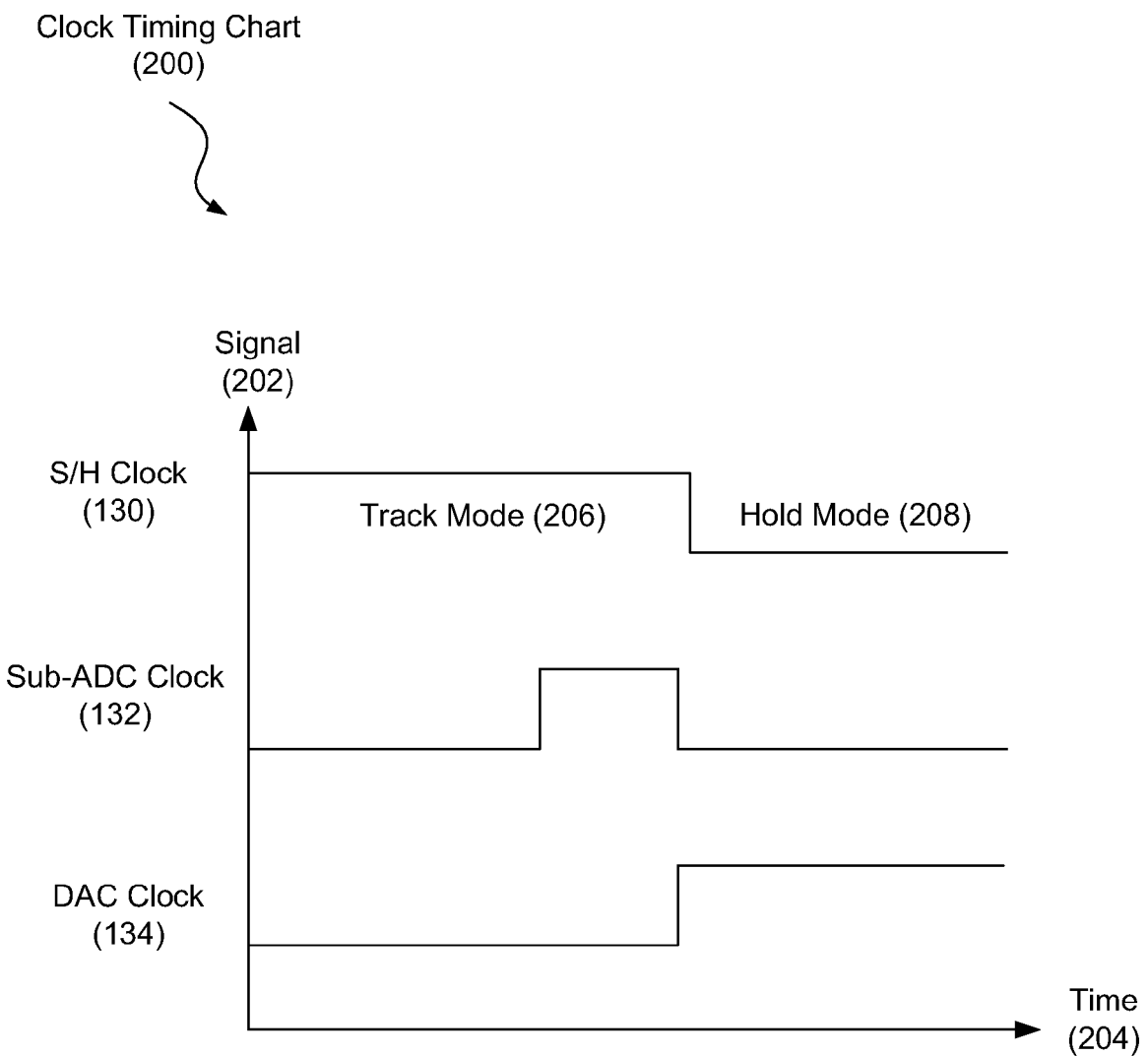
FIG. 2B illustrates the clock signals used to manage the various electronic devices within a stage of the pipelined ADC, according to principles described herein.

FIG. 2B illustrates the clock signals (130, 132, 134) used to manage the various electronic devices within a stage of the pipelined ADC. Specifically, a sample and hold clock signal (130) is used to set the sample and hold circuit (124) to either a track mode or a hold mode. The sub-ADC clock (132) is used to cause the comparators within the sub-ADC (122) to start operation and begin resolving a value of the received input signal. The DAC clock (134) is used to cause the DAC (123) to produce an analog representation based on the digital representation received from the sub-ADC (122).

FIG. 2B is a clock timing chart (200) illustrating the timing of the clock signals (130, 132, 134) of FIG. 2A. The horizontal axis of the graph represents time (204) the vertical axis of the graph represents signal value. Each clock signal is set to either a high state or a low state. The state of a clock signal is used to control the functionality of the electronic devices it operates.

While the sample and hold clock signal (130) is high, the sample and hold circuit (124) is in a track mode (206). Thus, the output of the sample and hold circuit (124) will track the input of the sample and hold circuit. When the sample and hold clock signal (130) goes low, then the sample and hold circuit will enter a hold mode (208). While in hold mode, the output of the sample and hold circuit will be the value of the input at the instant the sample and hold circuit. This instant is referred to as the sampling instant.

While the sub-ADC clock signal (132) is low, the output of the comparators within the sub-ADC (122) is still producing the output from the last sample. When the sub-ADC clock goes high, the comparators within the sub-ADC (122) are reset and begin resolving an output value based on the present input signal. As the sub-ADC clock signal (132) goes low again, the output of the comparators within the sub-ADC (122) resolve to their final value. As can be seen from the clock timing chart (200), this happens right before the sample and hold circuit enters the hold mode (208). Although the sub-ADC begins resolving a value before the sampling instant of the sample and hold circuit, the value of the signal at this point is close enough that the analog value of the signal at this point will still produce the proper digital output from the sub-ADC.

When the DAC clock signal (134) goes from low to high, the DAC (123) begins the process of producing an analog representation of the digital input received from the sub-ADC (122). As can be seen from the clock timing chart (200). The sub-ADC (122) finishes resolving the value for its digital output before the DAC (123) begins producing an analog representation of that digital output signal. This allows the DAC (123) to produce an analog output signal at the same time the sample and hold circuit (124) enters a hold mode. This allows the output signal from the DAC and the output signal from the sample and hold to be ready to be combined at the same instant. A pipelined ADC embodying timing principles described herein will be able to operate at faster speeds.

Figure 6:
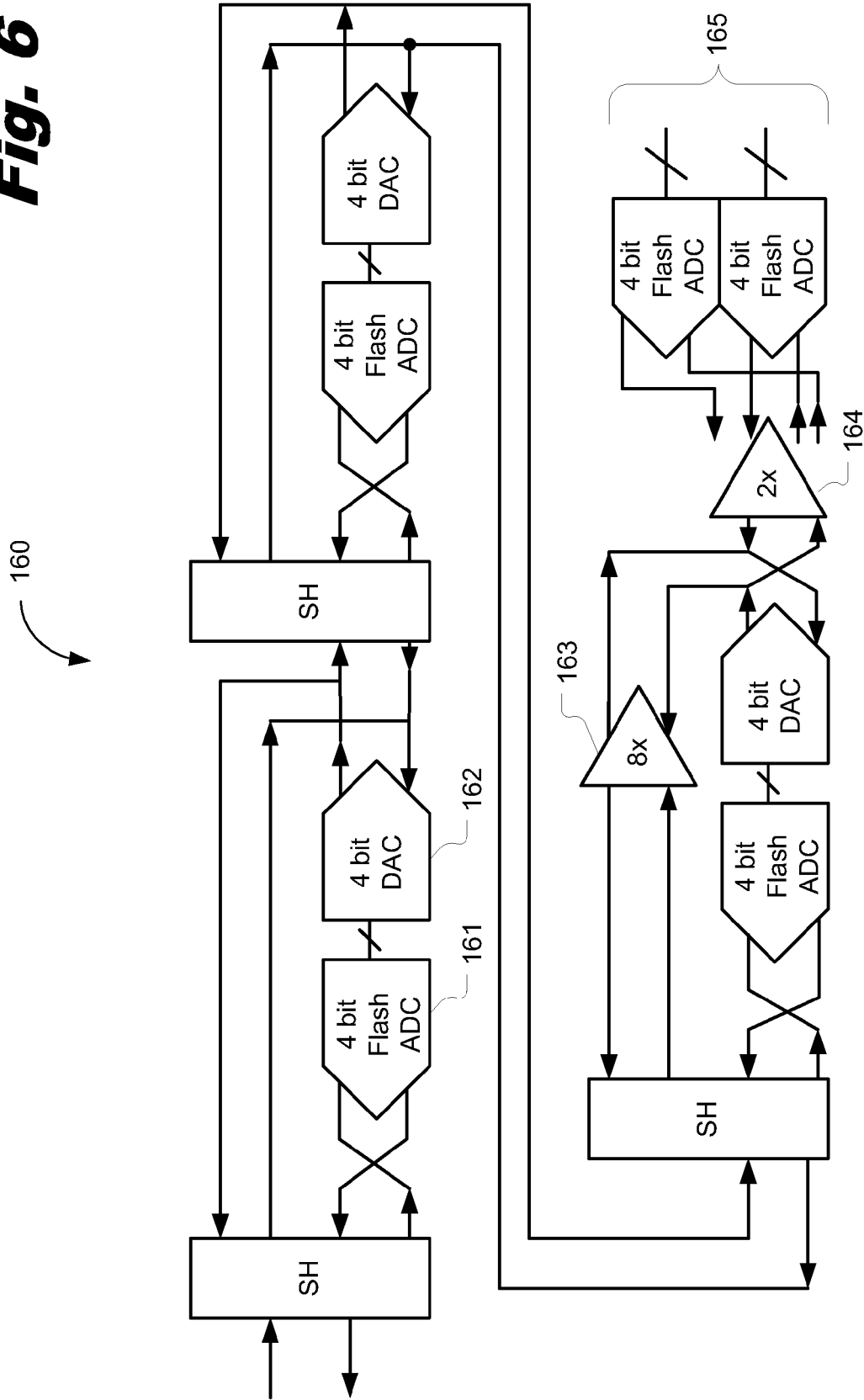
FIG. 6 illustrates an exemplary current mode pipelined ADC wherein the components are each four bits according to principles described herein.

Because the output signal of the DAC (123) is in terms of current, it can be subtracted directly from the output signal of the voltage-to-current converter (121) without the need for a summing block simply by electrically connecting the output of the DAC (123) to the output of the voltage-to-current converter (121). Consequently, the signals are summed at a node (e.g., SUM) shown in FIG. 2A before being input to a sample and hold (S/H) circuit (124). This subtraction results in a residue current signal having a current equal to $I_{INP}$-$I_{DACP}$ that is input into a sample and hold (S/H) circuit (124) of the next stage. It should be noted that the circuits can also be designed such that $I_{DACP}$ is larger than $I_{INP}$ resulting in a residue current signal equal to $I_{DACP}$-$I_{INP}$. In such cases, the lines between the S/H and the flash ADC may be crossed to invert the signal, as shown in FIG. 6.

In some examples, because the flash ADCs (122) in the pipelined ADC (120) are current mode ADCs, no amplification of the residual current is needed prior to being input into the S/H circuit (124) of the next stage. This is because the current mode ADCs (122) may be configured to be able to process very low amplitude signals. Hence, the current mode pipelined ADC (120) is advantageous in many applications.

The current mode pipelined ADC (120) shown in FIG. 2A may include any number of bits of resolution and/or stages. For example, FIG. 6 illustrates an exemplary current mode pipelined ADC (160), where the components are each four bits. As shown in FIG. 6, each stage of the current mode pipelined ADC (160) includes a 4-bit flash ADC (161) and a 4-bit DAC (162) for illustrative purposes. It will be recognized that the flash ADC (161) and DAC (162) may have any number of bits as best serves a particular application.

Rather than scaling the residual signal coming out of each summing function back to its original value, the current is allowed to scale down by a factor of 8 (or any other suitable factor) in each stage. In some embodiments, the current may be scaled up by 8 (or any other suitable factor) for convenience, for example, using amplifier (163) in the last stage. However, it will be recognized that the current does not have to be amplified in the last stage in some alternative embodiments.

As further shown in FIG. 6, one or more additional amplifiers (e.g., amplifier 164) and one or more additional ADCs (165) may be included after all of the stages. These components may be added to adjust the number of bits of resolution of the pipelined ADC (160). For example, with the 2× amplifier (164) and the two current mode 4-bit flash ADCs (165), the references of the ADCs (165) may be adjusted slightly to effectively result in a 5-bit pipelined current mode ADC (160).

In some examples, one or more of the components within the pipelined current-mode ADC (120) described herein may be tested to ensure proper functionality. It is often difficult to determine if variations or defects from manufacturing in the individual flash ADC or DAC blocks have caused the overall performance of the pipelined ADC to be degraded.

Figure 7:
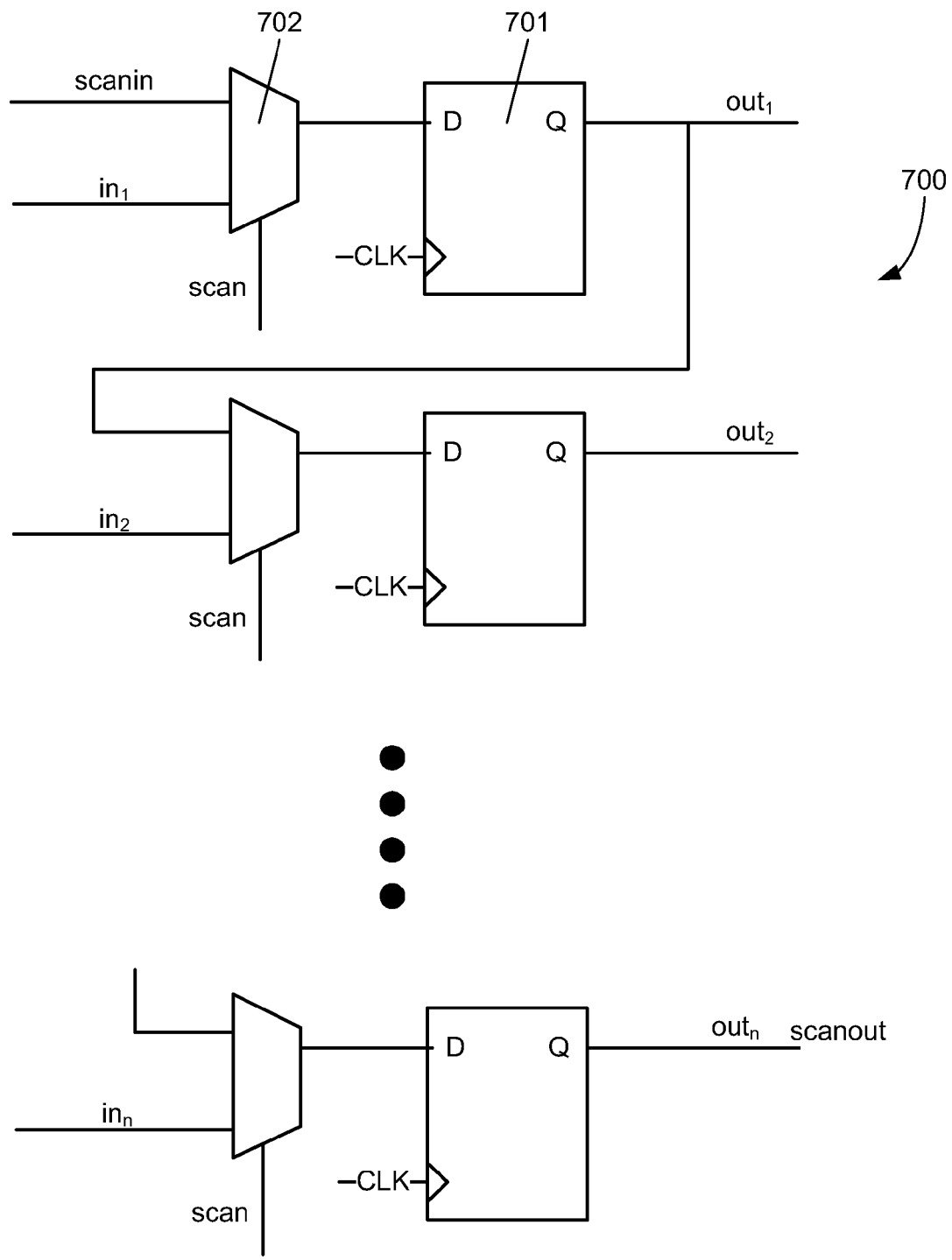
FIG. 7 illustrates an exemplary scan chain for testing digital circuitry according to principles described herein.

Referring now to FIG. 7, a common technique for testing digital circuitry is called a scan chain (700). The scan chain (700) is composed of a series of flip flops (e.g., 701) Each of the flip flops (701) is connected to a multiplexer circuit (e.g., 702) that allows the series of flip flops (701) to be configured into a serial shift register when the "scan" signal is asserted as illustrated in FIG. 7. This allows the contents of all the flip flops (701) to be clocked out serially on the "scanout" signal line. Alternatively, the flip flops (701) can be loaded by clocking in a pattern presented to the "scanin" signal.

Referring additionally to FIG. 2A, the digital output of the flash ADC (122) is normally held in a register for input into the following DAC (123) within each stage in the pipelined ADC (120). If the scan chain (700) acting as a serial shift register has the multiplexer circuitry (702) as shown in FIG. 7, the stage (FIG. 2A) of the ADC (120) can be tested by scanning values into and out of this intermediate register (700, FIG. 7) to evaluate what the result of the flash ADC conversion was, as well as change the output of the DAC by scanning in a new digital value for the DAC to convert to analog. This may utilize multiplexers connected the scan chain (700) to the input and output of the ADC (122) and the DACs (123) in the pipelined converter (120).

For example, the scan chain (700) may receive the output of an ADC (122) to allow a determination whether the code coming out of the ADC (122) is correct given the corresponding input. If so, the ADC (122) is functioning correctly. A code may be input from the scan chain (700) to a DAC (123) so that the DAC's output can be used by the next ADC in a subsequent stage to determine if the next ADC is functioning correctly. Additionally, after the code is input to the DAC, the code's analog value output by the DAC to a downstream sample and hold circuit (124) can be checked to determine if the DAC is functioning correctly.

For example, the flash ADC (122, FIG. 2A) within each stage may be tested by inputting a test signal into the voltage-to-current converter (121) and scanning out the resulting answers from one or more of the flash ADCs (122). In some examples, the scan clock (CLK, FIG. 7) is separate from the sample and hold clock. Testing the flash ADC (122) in this manner may also effectively test an entire stage corresponding to the flash ADC (122). Hence, in the example given in FIG. 2A, by inserting a scanning register (700) in between the flash ADC (122) and DAC (123), the entire first stage of the pipelined current mode ADC (120) may be tested.

Additionally or alternatively, the pipelined ADC (120) may be tested by loading a value onto one or more of the DACs (123) independent of what each of the ADCs (122) are doing. In this manner, an analog signal output from a DAC (123) may be analyzed to verify functionality thereof. In some examples, the analog output signal from the DAC (123) may be accessed by one or more test devices by providing a third replica of the outputs from the DAC's corresponding sample and hold circuit (124).

Additionally or alternatively, once one of the DACs (123) is determined to function properly, it can be used to test one or more of the ADCs (122) within any of the stages. For example, if the first stage DAC (123) is tested and found to function properly, its output may be input into the first stage ADC (122) or any other ADC within any other stage to test functionality thereof. Thus, if it is determined that an ADC is functioning correctly, a multiplexer can be used to rout the signal from any of the DACs to that ADC so that any of the DACs can be tested using the ADC that is known to work.

Likewise, once one of the ADCs (122) is determined to function properly, it can be used to test one or more of the DACs (123) within any of the stages. For example, if the first stage ADC (122) is tested and found to function properly, its output may be input into the first stage DAC (123) or any other DAC within any other stage to test functionality thereof. Thus, it if is determined that a DAC is functioning correctly, the output of that DAC can be routed with a multiplexer to the input of an ADC under test to test the functionality of that ADC.

Figure 8:
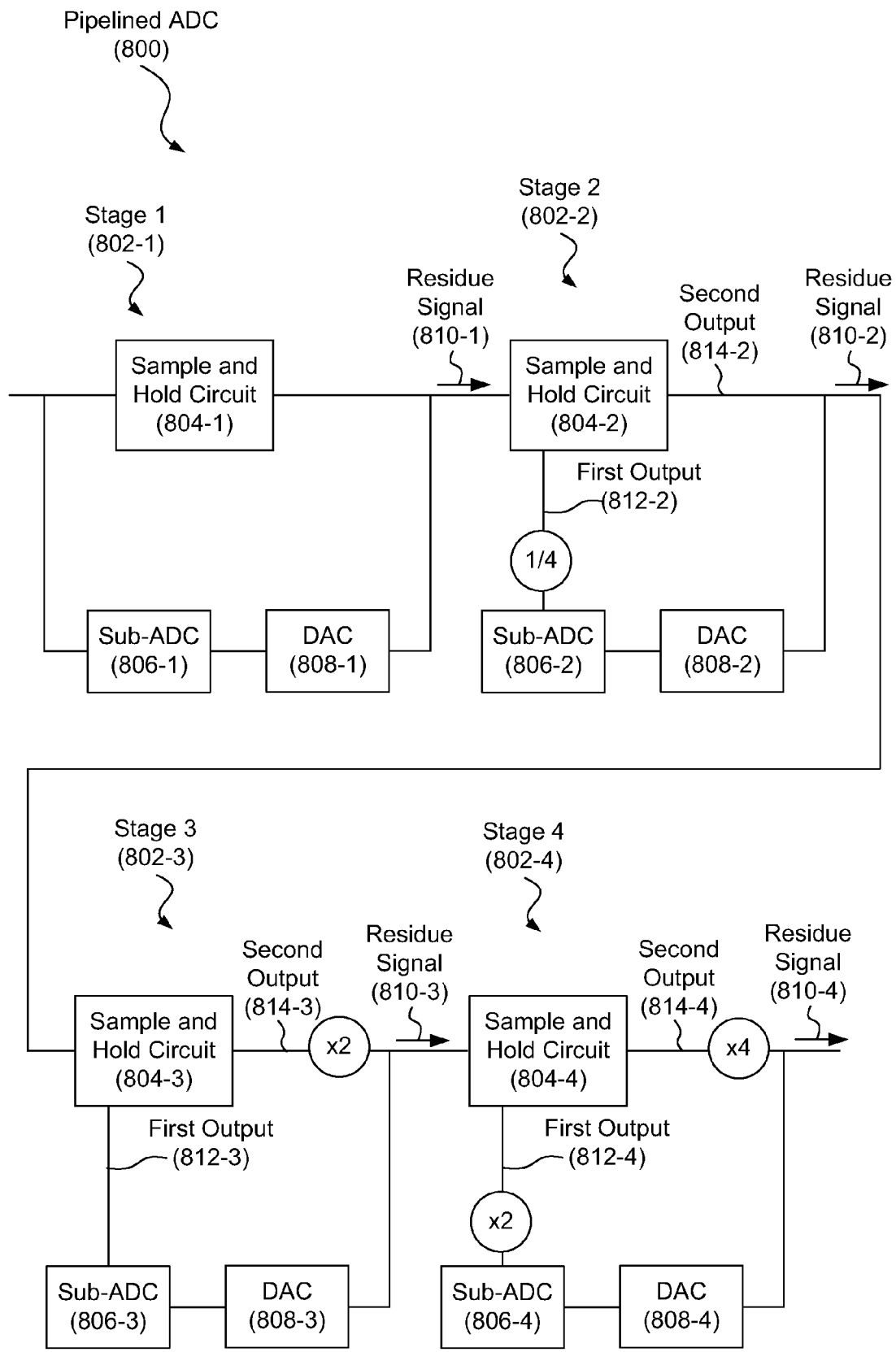
FIG. 8 is a diagram showing illustrative stages of a pipelined analog-to-digital converter, according to one example of principles described herein.

FIG. 8 is a diagram showing illustrative stages of a pipelined analog-to-digital converter. According to certain illustrative examples, each stage of the pipelined ADC can be configured to receive and process a signal in a different manner. This allows flexibility in the circuit design to account for various non-idealities. As mentioned above, each stage (802) includes a sample and hold circuit (804), a sub-ADC (806), and a DAC (808). The following will describe how different stages can process a signal differently.

In stage 1 (802-1), the sample and hold circuit (804-1) includes one input and one output. The signal which is input into the sample and hold circuit (804-1) is also input into the sub-ADC (806-1). As is characteristic with each stage, the sub-ADC produces a digital representation of the input signal. This digital representation of the input signal is then used to determine some of the bits for the total number of bits produced by the pipelined ADC (800). The digital representation of the input signal is then input into the DAC (808-1). The DAC (808-1) then produces an analog representation of the digital representation of the input signal. The output of the DAC (808-1) is then combined with the output of the sample and hold circuit to produce a residue signal (810-1). The residue signal is then input into a subsequent stage for further processing.

The sample and hold circuit (804-2) of stage 2 (802-2) includes one input and two outputs. The first output (812) is connected to the sub-ADC (806-2) and the second output (814) is connected to a node which combines signals from the sample and hold circuit (804-2) and the output of the DAC (808-2) to form the residue signal (810-2). The sample and hold circuit (804-2) can be configured to scale the two outputs independently. In the example of stage 2 (802-2), the first output (812-2) is scaled down by a factor of 4 and the second output (814-2) is not scaled at all. In the example of stage 3 (802-3), the first output (812-3) is not scaled while the second output (814-3) is scaled up by a factor of 2. In the example of stage 4 (802-4), the first output (812-4) is scaled up by a factor of 2 and the second output (814-4) is scaled up by a factor of 4.

Scaling the outputs of the sample and hold circuit (804) circuit allows flexibility in the design for each stage. For example, in stage 2 (802-2), scaling down the first output of the sample and hold circuit (804-2) allows for use of a sub-ADC (806-2) which operates at a smaller full-scale level. The full-scale level of an ADC refers to the range of analog signal values which the device is configured to convert to a digital signal. Likewise, the full-scale level of a DAC refers to the range of analog signal value which can be produced based on a received digital signal. Scaling down to a smaller full-scale device may save power in stages where the desired accuracy can still be achieved with the lower full-scale device. In some cases, the first output (812) or the second output (814) for a particular stage can be scaled up. This can be beneficial to provide better accuracy in the case that the input signal to the stage is too small to be measured accurately.

In some examples, the circuitry which performs the scaling can be external to the sample and hold circuit. For example, an amplifier circuit separate from the sample and hold circuit (804) may be used to scale the signals according to the design purposes of a particular stage.

According to some illustrative examples, the timing of the sample and hold circuit (804) and the sub-ADC (806) can be configured to increase the efficiency of the pipelined ADC (800). The sample and hold circuit (804) operates in two modes. The first mode is referred to as the sample mode, also referred to as the track mode. During the track mode, an output of the sample and hold matches the input signal. When the sample and hold circuit (804) switches to a hold mode, the output will maintain (804) the value of the input signal at the moment the sample and hold circuit (804) was switched into hold mode. The sub-ADC (806) includes a number of comparators. Before these comparators output a decision, they are placed into a reset mode. The comparators of the sub-ADC (806) can be brought out of reset mode right before the sample and hold circuit (804) switches to a hold mode. This allows the sub-ADC (806) to begin resolving a value while the sample and hold circuit is still in track mode. This allows the resolved value from the sub-ADC (806) to be ready for the DAC (808) at the instant that the sample and hold circuit enters the hold mode.

Figure 9:
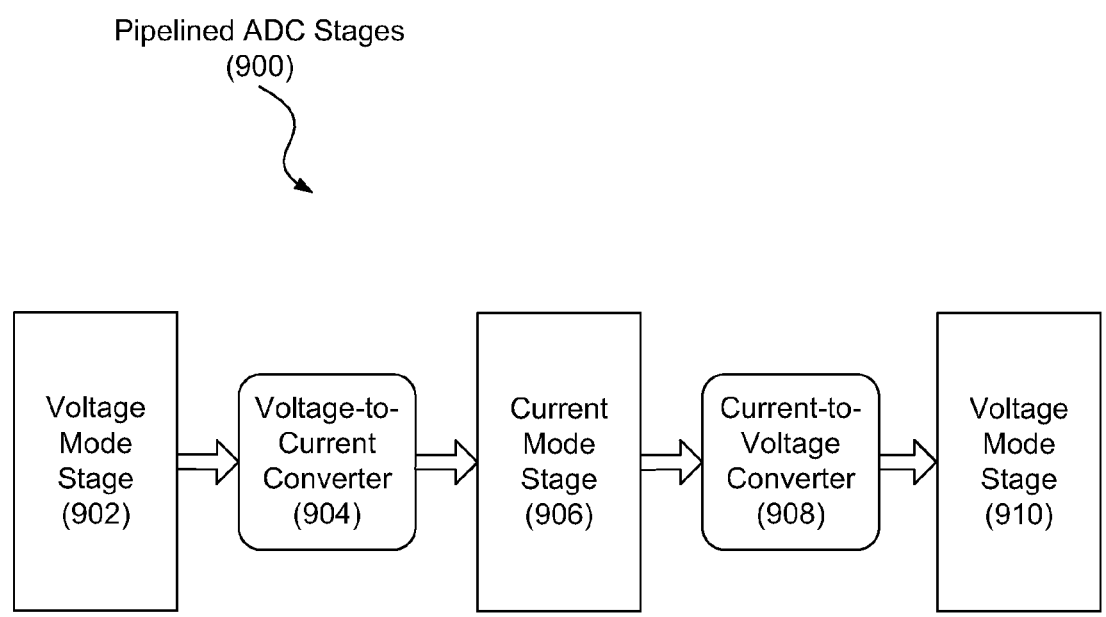
FIG. 9 is a diagram showing an illustrative set of pipelined ADC stages in different modes, according to one example of principles described herein.

FIG. 9 is a diagram showing an illustrative set of pipelined ADC stages (900) in different modes. According to certain illustrative examples, some of the pipelined ADC stages may be voltage mode stages and some of the pipelined ADC stages may be current mode stages. A voltage-to-current converter (904) can be used to convert the voltage signal from a voltage mode stage (902) to a current signal for a current mode stage (906). Likewise, a current-to-voltage converter (908) can be used to convert the current signal of a current mode stage (906) to a voltage signal for a voltage mode stage (910).

A voltage-to-current converter (904) or a current-to-voltage convert may include a simple device such as a resistor or a more sophisticated device such as a transimpedance amplifier. Switching between voltage and current mode stages may be beneficial in some circumstances. For example, a pipelined ADC may be designed to receive an analog voltage signal as an input and output a digital voltage signal. The first and last stages of such a pipelined ADC may be voltage mode stages and the intermediate stages may be current mode stages. Current mode stages may provide benefits such as lower power consumption.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A pipelined Analog-to-Digital Converter (ADC) comprising a number of stages, at least one of said stages comprising:
    a sample and hold circuit comprising:
       a first output connected to an input of a sub-ADC, an output of said sub-ADC connected to an input of a Digital-to-Analog Converter (DAC), an output of said DAC connected to a node; and
       a second output connected to said node;
    in which said sample and hold circuit is configured to independently scale a first signal produced by said first output and a second signal produced by said second output.

2. The pipelined ADC of claim 1, in which said sample and hold passes said first signal to said sub-ADC while said sample and hold circuit is in a track mode.

3. The pipelined ADC of claim 2, in which said sub-ADC is clocked to resolve a digital output before said sample and hold enters a hold mode.

4. The pipelined ADC of claim 1, in which said node combines a signal from said second output of said sample and hold with a signal from said output of said DAC to form a residue signal.

5. The pipelined ADC of claim 2, in which said residue signal is scaled in at least one of said stages and is not scaled in at least one of said stages.

6. The pipelined ADC of claim 1, in which at least one of said stages is a voltage mode stage and at least one of said stages is a current mode stage.

7. The pipelined ADC of claim 6, further comprising a voltage-to-current converter to convert a voltage signal from said at least one voltage stage to a current signal for said at least one current stage.

8. The pipelined ADC of claim 6, further comprising a current-to-voltage converter to convert a current signal from said at least one current stage to a voltage signal for said at least one voltage stage.

9. The method of claim 8, in which at least one of said stages is a voltage mode stage and at least one of said stages is a current mode stage.

10. The method of claim 9, further comprising, with a voltage-to-current converter, converting a voltage signal from said voltage stage to a current signal for said current stage.

11. The method of claim 9, further comprising, with a current-to-voltage converter, converting a current signal from said current stage to a voltage signal for said voltage stage.

12. A method of converting an analog signal into a digital signal performed by a pipelined Analog-to-Digital Converter (ADC), said pipelined ADC comprising a number of stages, the method comprising:
    with a sample and hold circuit of a stage of said pipelined ADC, receiving an input signal;
    with a first output of said sample and hold circuit, outputting a first signal to a sub-ADC, said sub-ADC converting an analog representation of said first signal into a digital representation of said first signal;
    with said sub-ADC, outputting said digital representation of said first signal to a Digital-to-Analog Converter (DAC), said DAC converting said digital representation of said first signal to an analog representation of said first signal; and
    with a second output of said sample and hold circuit, outputting a second signal to be combined with said analog representation of said first signal being output from said DAC to form a residue signal;
    in which said first signal and said second signal are independently scaled.

13. The method of claim 12, further comprising, causing said sample and hold to pass said first signal to said sub-ADC while said sample and hold circuit is in a track mode.

14. The method of claim 13, further comprising, clocking said sub-ADC to resolve a digital output before said sample and hold enters a hold mode.

15. The method of claim 12, further comprising scaling said residue signal in at least one stage of said pipelined ADC and not scaling said residue signal in at least one stage of said pipelined ADC.

16. The method of claim 12, in which said first signal and said second signal are scaled with circuitry within said sample and hold circuit.

17. The method of claim 12, in which said first signal and said second signal are scaled with circuitry external to said sample and hold circuit.

18. A circuit comprising a pipelined Analog-to-Digital Converter (ADC) comprising a number of stages, at least one of said stages comprising:
    a sample and hold circuit configured to:
       receive an input signal;

output a first signal to a sub-ADC, an output of said sub-ADC connected to a Digital-to-Analog Converter (DAC); and output a second signal to be combined with a signal output from said DAC to form a residue signal to be input into a subsequent stage;

in which said first signal and said second signal are independently scaled.

19. The circuit of claim 18, in which said sample and hold passes said first signal to said sub-ADC while said sample and hold circuit is in a track mode and said sub-ADC is clocked to resolve a digital output before said sample and hold enters a hold mode.

20. The circuit of claim 18, in which said first signal and said second signal are independently scaled by one of: circuitry within said sample and hold circuit and circuitry external to said sample and hold circuit.

* * * * *